(12) United States Patent
Ramachandra et al.

(10) Patent No.: US 10,381,327 B2
(45) Date of Patent: Aug. 13, 2019

(54) NON-VOLATILE MEMORY SYSTEM WITH WIDE I/O MEMORY DIE

(71) Applicant: SANDISK TECHNOLOGIES LLC, Plano, TX (US)

(72) Inventors: Venkatesh P. Ramachandra, San Jose, CA (US); Michael Mostovoy, San Ramon, CA (US); Hem Takiar, Fremont, CA (US); Gokul Kumar, San Jose, CA (US); Vinayak Ghatawade, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/287,344

(22) Filed: Oct. 6, 2016

(65) Prior Publication Data

US 2018/0102344 A1   Apr. 12, 2018

(51) Int. Cl.
*H01L 25/065* (2006.01)
*H01L 25/18* (2006.01)
(Continued)

(52) U.S. Cl.
CPC ...... *H01L 25/0657* (2013.01); *G06F 13/4018* (2013.01); *G06F 13/4234* (2013.01); *G11C 5/04* (2013.01); *G11C 5/063* (2013.01); *G11C 5/066* (2013.01); *G11C 7/065* (2013.01); *G11C 7/10* (2013.01); *G11C 7/22* (2013.01); *G11C 29/781* (2013.01); *H01L 25/18* (2013.01); *G11C 2207/105* (2013.01); *G11C 2207/108* (2013.01); *H01L 2225/0651* (2013.01); *H01L 2225/06506* (2013.01); *H01L 2225/06562* (2013.01); *H01L 2225/06582* (2013.01); *H01L 2924/1431* (2013.01); *H01L 2924/1434* (2013.01)

(58) Field of Classification Search
CPC .. G11C 7/065; G11C 7/10; G11C 7/22; G11C 29/781; H01L 25/0657; H01L 25/18
See application file for complete search history.

(56) References Cited

U.S. PATENT DOCUMENTS 7,319,621 B2   1/2008   Ba
7,420,281 B2 *  9/2008   Tsunozaki ............... H01L 23/60
                                                      257/723
(Continued)

OTHER PUBLICATIONS

JEDEC Standard, Wide I/O 2 Standard, JEDEC Solid State Technology Association, Aug. 2014.
(Continued)

*Primary Examiner* — Tri M Hoang
(74) *Attorney, Agent, or Firm* — Vierra Magen Marcus LLP

(57) ABSTRACT

A non-volatile storage system includes a plurality of memory dies and an interface circuit. Each memory die includes a wide I/O interface electrically coupled to another wide I/O interface of another memory die of the plurality of memory dies. The interface circuit is physically separate from the memory dies. The interface circuit includes a first interface and a second interface. The first interface comprises a wide I/O interface electrically coupled to a wide I/O interface of at least one of the memory dies of the plurality of memory dies. The second interface is a narrow I/O interface configured to communicate with an external circuit.

17 Claims, 10 Drawing Sheets

(51) Int. Cl.

| | | |
|---|---|---|
| *G11C 7/10* | (2006.01) | |
| *G11C 7/22* | (2006.01) | |
| *G11C 29/00* | (2006.01) | |
| *G11C 7/06* | (2006.01) | |
| *G06F 13/40* | (2006.01) | |
| *G06F 13/42* | (2006.01) | |
| *G11C 5/04* | (2006.01) | |
| *G11C 5/06* | (2006.01) | |

(56) References Cited

U.S. PATENT DOCUMENTS

| | | | |
|---|---|---|---|
| 7,514,796 B2* | 4/2009 | Saeki | H01L 23/49833 257/202 |
| 7,683,491 B2* | 3/2010 | Itoh | H01L 23/50 257/685 |
| 7,755,385 B2 | 7/2010 | Sreeramaneni | |
| 8,158,457 B2 | 4/2012 | Wu | |
| 8,233,303 B2 | 7/2012 | Best | |
| 8,415,808 B2 | 4/2013 | Liao | |
| 8,648,429 B2 | 2/2014 | Song | |
| 8,797,811 B2 | 8/2014 | Oh | |
| 8,884,416 B2 | 11/2014 | Lee | |
| 9,142,261 B2 | 9/2015 | d'Abreu | |
| 9,213,603 B2 | 12/2015 | Tiziani | |
| 9,311,979 B1 | 4/2016 | Ramachandra et al. | |
| 9,396,766 B2 | 7/2016 | Lym | |
| 9,773,531 B2* | 9/2017 | Yoon | G11C 5/04 |
| 9,899,347 B1* | 2/2018 | Mostovoy | H01L 24/49 |
| 2007/0165457 A1* | 7/2007 | Kim | G06F 13/1684 365/185.11 |
| 2009/0018770 A1 | 1/2009 | Burgess | |
| 2009/0059641 A1 | 3/2009 | Jeddeloh | |
| 2010/0091537 A1* | 4/2010 | Best | G11C 5/02 365/51 |
| 2010/0118482 A1* | 5/2010 | Kim | G06F 3/0626 361/679.32 |
| 2011/0075497 A1 | 3/2011 | LaBerge | |
| 2011/0161568 A1* | 6/2011 | Bruce | G06F 12/00 711/103 |
| 2013/0070507 A1 | 3/2013 | Yoon | |
| 2014/0059359 A1 | 2/2014 | Bahirat | |
| 2014/0250260 A1 | 9/2014 | Yap | |
| 2014/0264906 A1 | 9/2014 | Fai | |
| 2014/0369148 A1 | 12/2014 | Matsui | |
| 2015/0302904 A1* | 10/2015 | Yoon | G11C 5/04 711/105 |
| 2015/0357310 A1 | 12/2015 | Kim | |

OTHER PUBLICATIONS

PCT International Search Report dated Nov. 14, 2017, PCT Patent Application No. PCT/US2017/050432.

PCT Written Opinion of the International Searching Authority dated Nov. 14, 2017, PCT Patent Application No. PCT/US2017/050432.

* cited by examiner

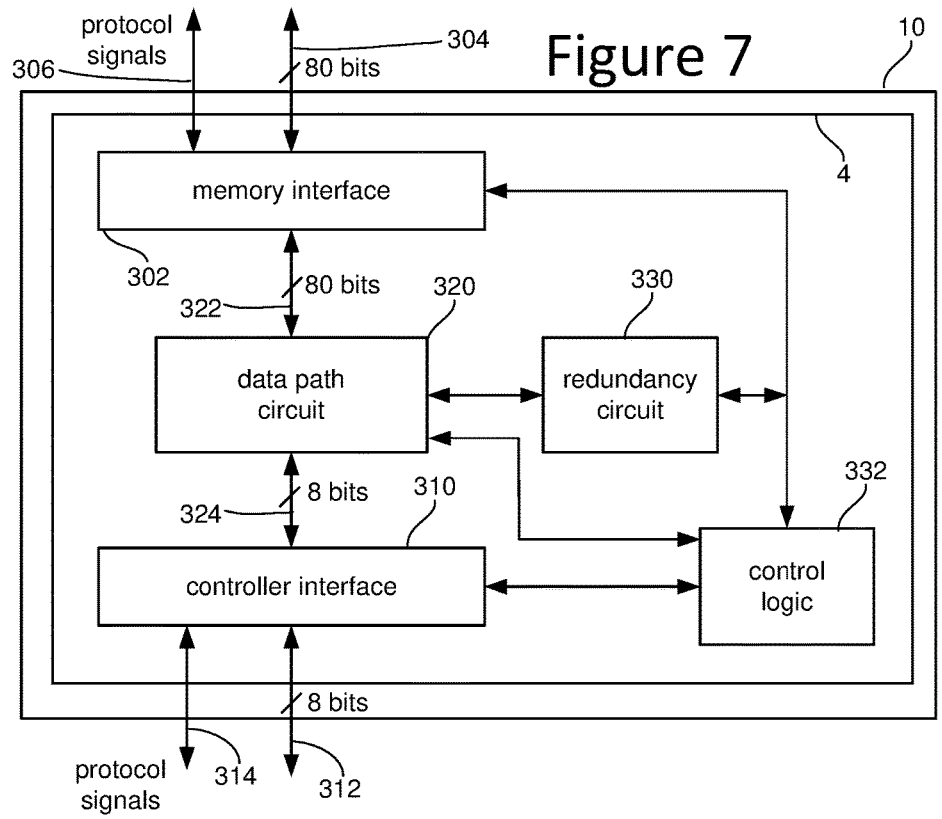
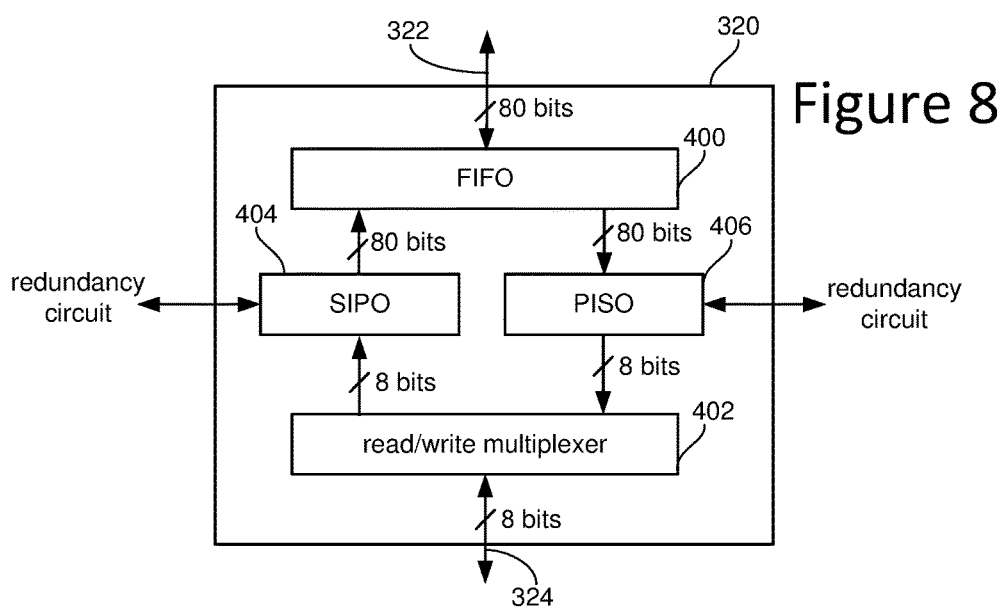

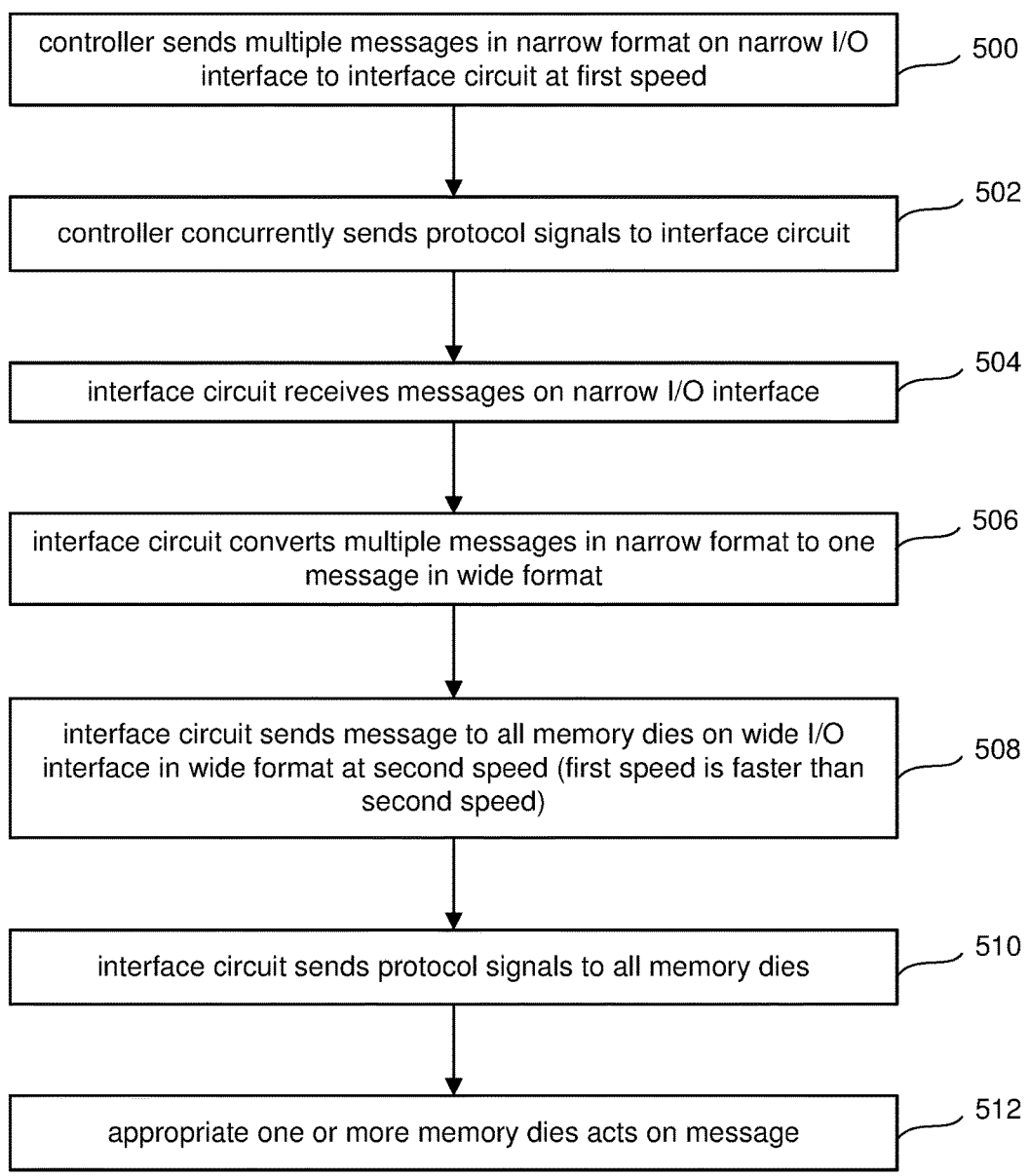

NON-VOLATILE MEMORY SYSTEM WITH WIDE I/O MEMORY DIE

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. As the demand for non-volatile memory increases, there is a desire for memories with high storage capacity and high performance, at reasonable costs.

BRIEF DESCRIPTION OF THE DRAWINGS

Like-numbered elements refer to common components in the different figures.

FIG. 7 is a block diagram of one embodiment of an interface die.

FIG. 8 is a block diagram of one embodiment of a data path circuit.

FIG. 9 is a flow chart describing one embodiment of a process for communicating from a controller to a memory die.

DETAILED DESCRIPTION

Figure 1:
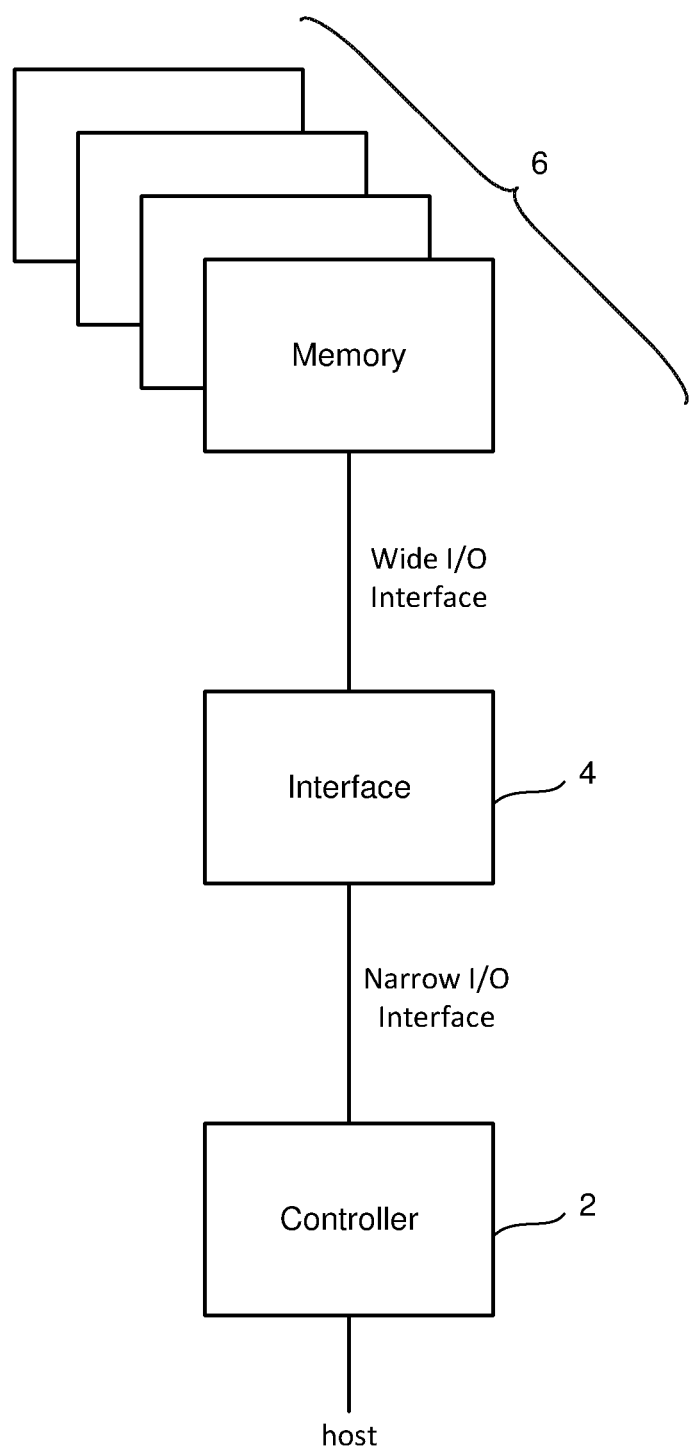
FIG. 1 is a block diagram of one embodiment of a non-volatile storage apparatus.

FIG. 1 is a block diagram of one embodiment of a proposed nonvolatile storage apparatus that includes a controller 2, an interface circuit 4, and a plurality of memory dies 6 that are electrically coupled together. Interface circuit is physically separate from the plurality of memory dies 6. Each memory die of the plurality of memory dies 6 includes a wide I/O interface electrically coupled to another wide I/O interface of another memory die of the plurality of memory dies 6. In one embodiment, all of the wide I/O interfaces of all of the memory dies of the plurality of memory dies 6 are connected together. Interface circuit 4 has a first interface and a second interface. The first interface is a wide I/O interface that is electrically coupled to a wide I/O interface of one or more of the memory dies of the plurality of memory dies 6. The second interface is a narrow I/O interface with less signals than the wide I/O interface and is configured to communicate with controller 2. Thus, interface circuit 4 is an electrical circuit that translates between two different interfaces. In some embodiments, interface circuit 4 is adapted to communicate directly with a host via the second interface.

The use of the plurality of memory dies 6 provides for higher storage capacity. The wide I/O interface provides high performance. Interface circuit 4 allows the system to be manufactured at a reasonable cost. For example, as discussed below, some of the circuits that typically would be found in each of the memory die are moved to interface circuit 4, thereby reducing the cost of each memory die for a total cost reduction that is more than the cost of using interface circuit 4.

Figure 2A:
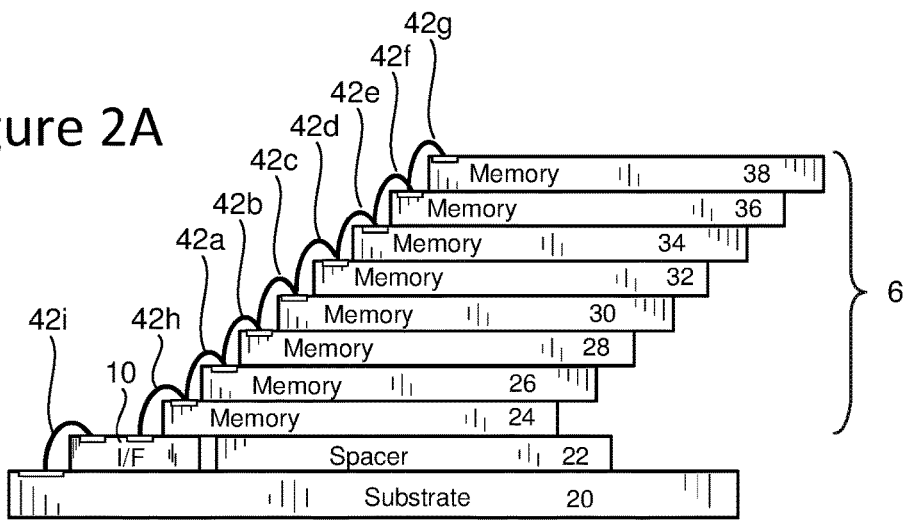
FIG. 2A is side view of one embodiment of a stack of memory dies and an interface die mounted on a substrate.

FIG. 2A is side view of one embodiment of the nonvolatile storage apparatus of FIG. 1. In one embodiment, interface circuit 4 is implemented on its own die, referred to in FIG. 2A as interface die 10 that is physically separate from any of the memory dies of the plurality of memory dies 6. In one embodiment, plurality of memory dies 6 are wire bonded together, are mounted on top of interface die 10 and are electrically connected to the interface die 10 (and interface circuit 4 implemented on interface die 10) by wire bonds between at least one of the memory dies and interface circuit 4. In other embodiments, other means for electrically connecting the components of FIG. 2A can also be used, such as solder bumps. Stack of memory dies 6 are mounted on both interface die 10 and spacer 22. Additionally, interface die 10 and spacer 22 are mounted on substrate 20.

While many varied packaging configurations are known, some non-volatile memory products may in general be fabricated as System-in-a-Package or multi-chip modules (MCM) where a plurality of dies are mounted and interconnected on a small footprint substrate. Substrate 20 may be formed of an electrically insulating core sandwiched between upper and lower conductive layers. The upper conductive layer may be etched to form conductor patterns that include contact pads for connecting to the interface die 10. Interface die 10 is mounted on and/or above the upper conductive layer. The lower conductive layer may be etched to form conductive patterns that include electrical leads. The electrical leads in the lower conductive layer of the substrate provide an electrical path between the device and a host device if the package device includes a controller. If the package device does not include a controller, the electrical leads on the lower conductive layer of the substrate can provide an electrical path to the controller 2. Additionally, there will be signal lines (e.g., vias) between the upper and lower conductive layers. Once the electrical connections between the dies and the substrates are made, the assembly is then typically encased in a molding compound to provide a protective package.

In one embodiment, the plurality of memory dies 6 include a vertical stack of eight memory dies 24, 26, 28, 30, 32, 34, 36 and 38. In other embodiments, more or less than eight memory dies can be used. In one embodiment, the bottom memory die 24 is mounted on top of interface circuit 4 and spacer 22. In other embodiments, bottom memory die 24 is mounted directly on the substrate (with no spacer). Memory die 26 is mounted on top of memory die 24. Memory die 28 is mounted on top of memory die 26. Memory die 30 is mounted on top of memory die 28. Memory die 32 is mounted on top of memory die 30. Memory die 34 is mounted on top of memory die 32.

Memory die 36 is mounted on top of memory die 34. Memory die 38 is mounted on top of memory die 37. In one embodiment, each of memory dies 24-38 have the exact same structure. In one embodiment, memory dies 24-38 such that each adjacent die is mounted in an offset position from its adjacent underneath die to form a staircase (as depicted in FIG. 2A).

In one embodiment, each of the memory dies 24-38 are affixed to their adjacent memory die using a DAF (die attach film). In one example, the DAF may be 8988 UV epoxy from Henkel Corporation of California, USA. FIG. 2A shows each of the memory dies 24-38 wire bonded to an adjacent memory die. For example, wire bond 42a connects memory 24 to memory die 26, wire bond 42b connects memory die 26 to memory die 28, wire bond 42c connects memory die 28 to memory die 30, wire bond 42d connects memory die 30 to memory die 32, wire bond 42e connects memory die 32 to memory die 34, wire bond 42f connects memory die 34 to memory die 36, wire bond 42g connects memory die 36 to memory die 38. Additionally, FIG. 2A shows wire bond 42h connecting memory die 24 to interface circuit 4 and wire bond 42i connecting interface 4 to substrate 20. FIG. 2A also shows a bunch of contact pads (not numbered). The wire bonds connect to the contact pads of the memory die. Because FIG. 2A is a side view, only the end wire bond for each memory die is depicted. However, there will be many wire bonds connecting adjacent dies, based on the sizes of the interface. In one embodiment, the interface between memory dies includes 91 signals (not including power). Therefore, between two adjacent memory dies, there will be at least 91 wire bonds.

Figure 2B:
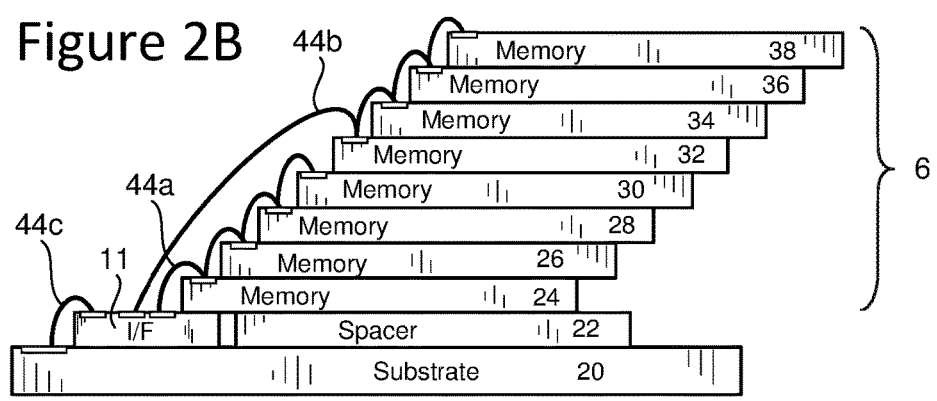
FIG. 2B is side view of one embodiment of a stack of memory dies and an interface die mounted on a substrate.

FIG. 2B shows another embodiment of the nonvolatile storage apparatus of FIG. 1. In this embodiment, interface circuit 4 (implemented on interface die 11) includes two channels of communication to the plurality memory dies 6. The first channel of communication is for communicating with memory die 24, memory die 26, memory die 28 and memory die 30. A second channel of communication is used to communicate with memory die 32, memory die 34, memory die 36 and memory die 38. Wire bond 44a, connecting interface die 11 with memory die 24, is for implementing the first communication channel. Wire bond 44b, connecting interface die 11 with memory die 32, is for implanting the second communication channel. Thus, in the embodiment of FIG. 2A, interface die 10 and interface circuit 4 have two interfaces: a first interface for communicating with all of the memory dies and a second interface for communicating with controller 2 via substrate 20. On the other hand, the embodiment of FIG. 2B, interface die 11 and the interface circuit have three interfaces: the first interface for communicating with the first set of memory dies 24-30 via wire bond 44a, the second interface for communicating with second set of memory dies 32-38 via wire bond 44b, and a third interface for communicating with controller 2 via wire bond 44c and substrate 20. In the embodiment of FIG. 2B, the memory dies 24-38 are stacked in the same manner (like a staircase) as in FIG. 2A, on top of interface die 11 and spacer 22.

Figure 2C:
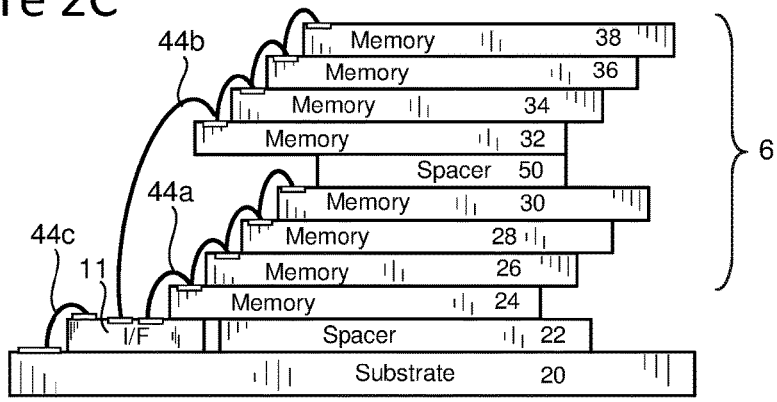
FIG. 2C is side view of one embodiment of a stack of memory dies and an interface die mounted on a substrate.

The embodiment of FIG. 2C also includes die 11 implementing two channels for communicating to two sets of memory dies. However, in the embodiment of FIG. 2C, each set of memory die is arranged in its own staircase with a spacer 50 between the two sets of memory die.

Figure 2D:
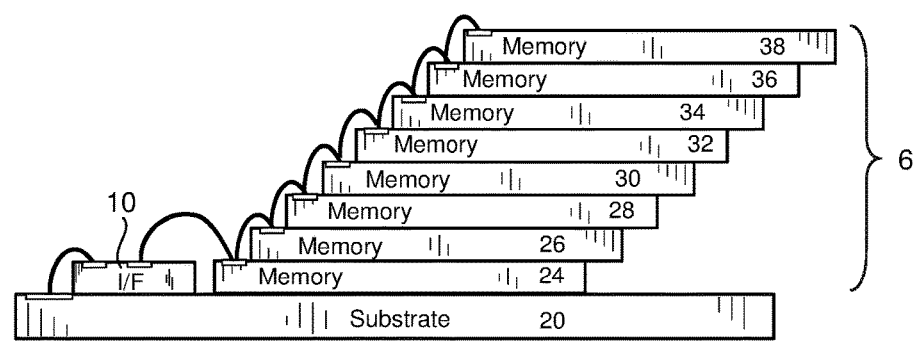
FIG. 2D is side view of one embodiment of a stack of memory dies and an interface die mounted on a substrate.

FIG. 2D depicts an embodiment that includes interface die 10 mounted on substrate 20 and the plurality of memory dies 6 also mounted on substrate 20 to the side of interface die 10.

Figure 3:
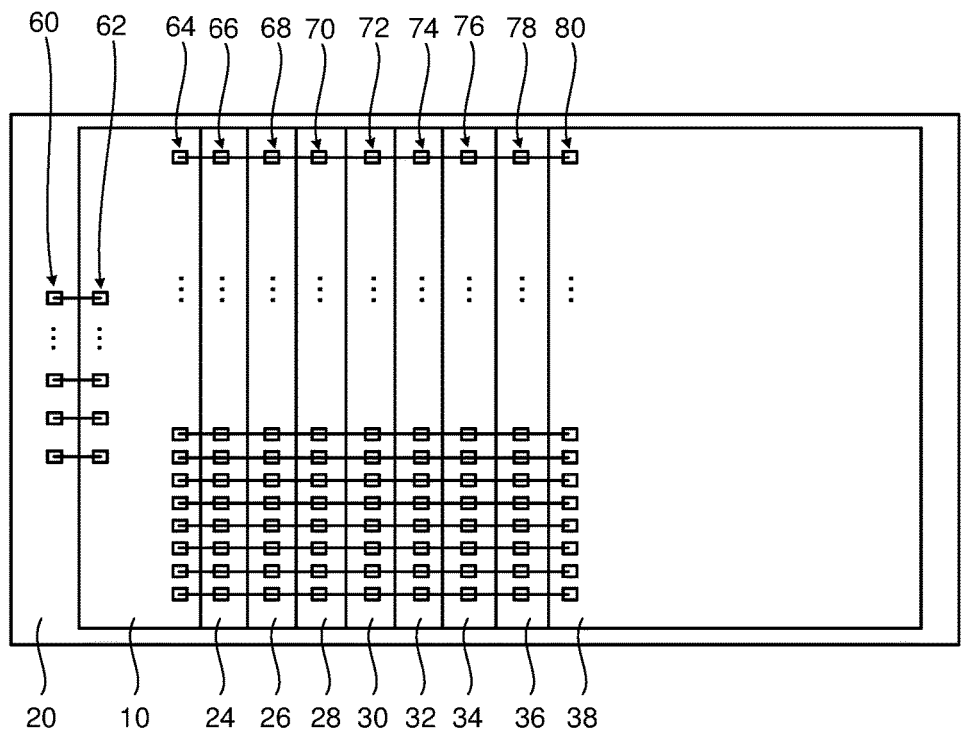
FIG. 3 is a top view of the embodiment of FIG. 2A.

FIG. 3 is a top view of the embodiment of FIG. 2A and depicts substrate 20, interface die 10, and memory dies 24-38. In one embodiment, each memory die includes 91 contact pads, depicted as rectangles in FIG. 3 (plus additional contact pads for power signals and ground). For example, memory die 24 includes contact pads 66, memory die 26 includes contact pads 68, memory die 28 includes contact pads 70, memory die 30 includes contacts pads 72, memory die 32 includes contacts pads 74, memory die 34 includes contacts pads 76, memory die 36 includes contacts pads 78, and memory die 38 includes contacts pads 80. Therefore, between each pair of adjacent memory dies there will be 91 wire bonds connecting the corresponding 91 contact pads (plus additional wire bonds and contact pads for power and ground). Additionally, the bottom memory die 24 will have wire bonds with interface die 10. Interface die 10 includes two interfaces: the first interface for the plurality of memory dies 6 and the second interface for controller 2 (or host or other external device) via substrate 20. The first interface between the memory dies 24-48 and interface die 10 includes ninety one contact pads 64 that are wire bonded to the ninety one contact pads 66 of memory die 24. Interface die 10 also includes the second interface that includes eighteen contact pads 62 which are wire bonded to the eighteen contact pads 60 of substrate 20. In one embodiment, the wire bonds between the adjacent memory dies 24-38 and the wire bonds between the bottom memory die 24 and interface die 10 are all the exact same length. Also, as depicted in FIG. 3, the wire bonds between memory dies 24-38 and the wire bonds between bottom memory die and 24 interface die 10 form straight lines of wire bonds from the top of the stack of memory dies 6 to interface die 10

As described above, interface die 10 includes two interfaces. The interface between interface die 10 and memory dies 24-38 is a wide I/O interface. The interface between interface die 10 and controller 2 (or other external device) via substrate 20 is a narrow I/O interface. The narrow I/O interface has less signals than the wide I/O interface. However, the narrow I/O interface is operated at a much faster speed (e.g., faster clock speed) than the wide I/O interface to maintain same throughput between first and second interface.

One advantage of interface die 10 is that it allows the interface on the substrate to be a smaller number of pads. Rather than the ninety one pads of the wide I/O interface, the substrate only communicates with the interface die using the eighteen pads of the narrow I/O interface. It has been observed that it is difficult to create ninety one pads and ninety one wire bonds on the substrate. It has been found that the substrate can be of poor material to wire bond; therefore, using wide I/O to the substrate would be difficult. Interface die 10 solves this issue.

Figure 4:
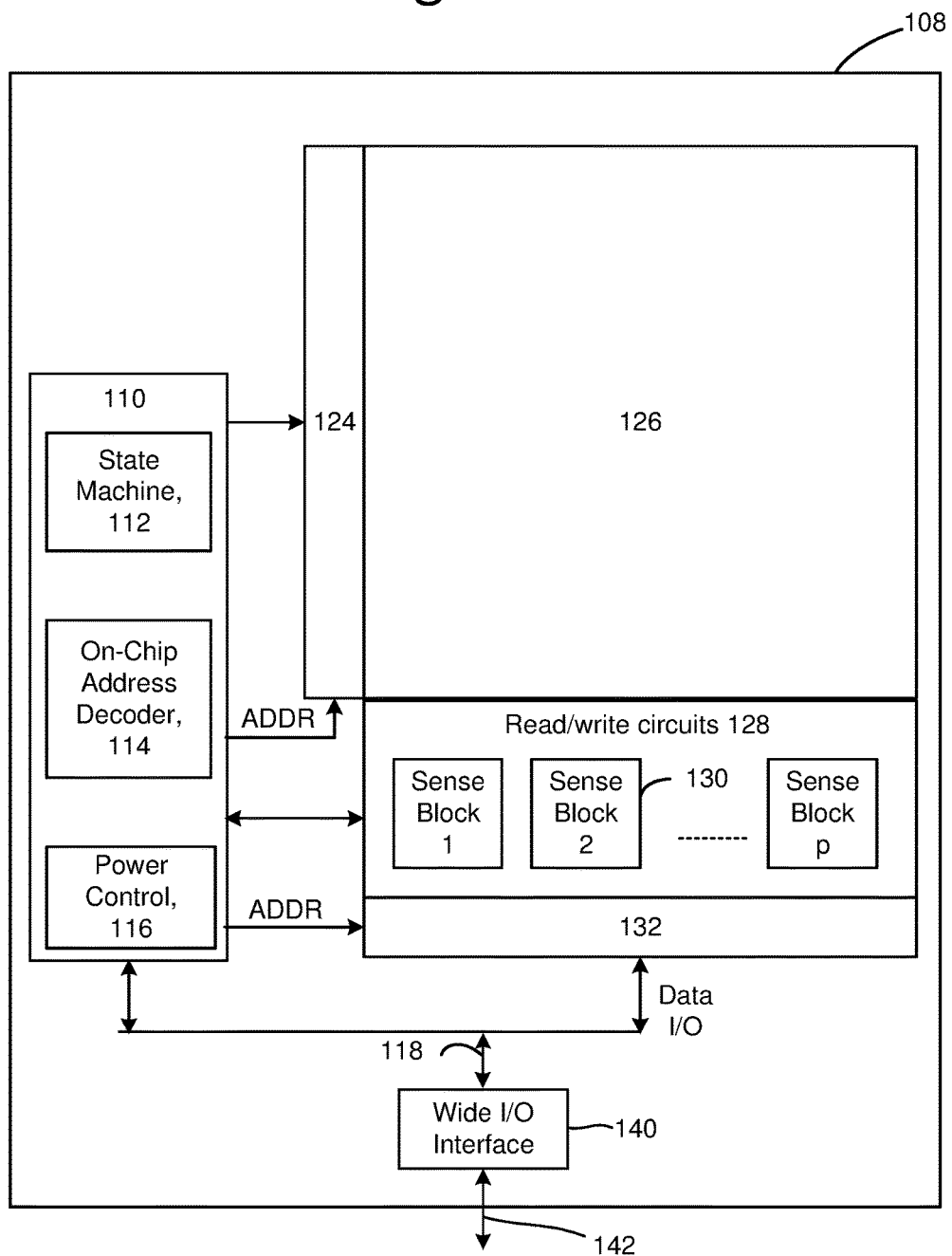
FIG. 4 is a block diagram of one embodiment of a memory die.

FIG. 4 is a functional block diagram of a memory die 108. In one embodiment, all of the memory dies depicted in FIGS. 1, 2A, 2B, 2C and 2D are implemented with the structure of memory die 108. In other embodiments, different memory dies can have different structures.

Memory die 108 includes a memory structure (e.g., memory array) 126 of memory cells, control circuitry 110, and read/write circuits 128. Memory structure 126 is a monolithic three dimensional memory structure in which multiple memory levels are formed above (and not in) a signal substrate, such as a wafer, with no intervening substrates. The memory structure may comprise any type of nonvolatile memory that is monolithically formed in one or more physical levels of memory cells having active as disposed above a silicone substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

The memory array 126 is addressable by word lines via a row decoder 124 and by bit lines via a column decoder 132. The read/write circuits 128 include multiple sense blocks 130 (sensing circuitry) and allow a page (or other unit) of memory cells to be read or programmed in parallel. In some embodiments, the sense blocks 130 include bit line drivers and circuits for sensing.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between a host or controller address and the hardware address used by the decoders 124 and 132. The power control module 116 controls the power and voltages supplied to the word lines and bit lines during memory operations. It can include drivers for word lines, source side select lines, drain side select lines and the source line.

Memory die 108 includes a wide I/O interface 140. Communication lines 118 connect wide I/O interface 140 to control circuitry 110 and column decoder 132. I/O communication lines 142 connect wide I/O interface 140 to an external circuit (e.g., a controller, host or other device that uses or interacts with memory die 108). In some embodiments, the I/O communication lines 142 of multiple memory die 108 are connected together and connected to interface circuit 4.

As used herein, a "wide I/O interface" is a parallel communication interface that includes an I/O bus configured to communicate data signals. The I/O bus includes a number of I/O signal lines that is greater, by at least a multiplication factor, than a second I/O bus on the same communication path. The multiplication factor is a whole number greater than one.

Wide I/O interface 140 provides an interface for communicating with memory die 108 that includes a wide data bus. On embodiment includes the following signals described in Table 1, below. Note that the designation "Input" or "Output" is from the point of view of memory die 108.

TABLE 1

| Signal Name | Type | Function |
|---|---|---|
| ALE | Input | Address Latch Enable. This input is used to indicate that the bus cycle is used to input an address. Addresses are latched on the rising edge of CLK. |
| CLE | Input | Command Latch Enable. This input is used to indicate that the bus cycle is used to input a command. Commands are latched on the rising edge of CLK. |
| R/Wn | Input | Read/Write. If ALE and CLE are not enabled, then this signal indicates whether the bus cycle is for transmitting read data or data to be written (programmed). When R/Wn = 1 then CLK is for read. When R/Wn = 0 then CLK is for write. |
| CLK | Input | Clock signal. If ALE = CLE = 0, then CLK is for read/write data. If ALE = 1, then CLK is for addresses. If CLE = 1, then CLK is for commands. |
| WPn | Input | Write Protect. This input signal is used to disable the memory die program and erase operations. |

TABLE 1-continued

| Signal Name | Type | Function |
|---|---|---|
| Bus[0:79] | Input/Output | Data Bus. Inputs commands and addresses; inputs data for Programming operations; and outputs data during Read operations. |
| WS[0:4] | Input | Word Select (during write/programming). Since the data bus is 80 bits and the external circuit can toggle a minimum of only 16 bits, memory die 108 needs to know which of the 80 bits to start writing from. Similarly at the end of the write/programming operation, memory die 108 needs to know how many bits the external circuit supplied. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |
| CEn | Input | Chip Enable. When Chip Enable is asserted, the memory dies shuts down. |

The embodiment of the wide I/O interface of Table 1 includes 91 signals. 80 of the 91 signals are the data bus. The other 11 signals (ALE, CLE, R/Wn, CLK, WPn, CEn WS[0:4] and R/Bn are referred to as protocol signals.

Although the table above provides signals and definitions for one embodiment of a wide I/O interface, other embodiments can use other signals. However, any wide I/O interface should have a wide data bus. The above-described embodiment of 80 bits in the wide data bus is just one example. Other embodiments can have more than or less than 80 bits. A wide data bus is a parallel bus that includes a number of signals that is greater than a narrow/smaller data bus by some factor such as 2, 4, 5, 8, 10, 100, etc. In one embodiment, the narrow I/O interface will include a data bus of 8 bits and the wide I/O interface includes a data bus of 80 bits, which is ten times the size of the narrow I/O interface data bus. In other embodiments, the wide data bus can be larger by factors other than ten, such as 5 (wide data bus is 40 bits) and 16 (wide data bus is 128 bits).

In other embodiments, the narrow I/O interface will include a narrow data bus of a different size than 8 bits. For example, the narrow I/O interface can have a narrow data bus of 10 bits, with the wide data bus larger by a factor of 9 (wide data bus is 90 bits) or 12 (wide data bus is 120 bits). In another alternative, the wide data bus can be 121 bits which is greater, by at least a multiplication factor of 12, than the narrow data bus.

By paying the cost of adding an interface circuit with the appropriate factor the system can support very high speeds on one side (the narrow side) and leverage the parallelism on the other side to operate at much slower speeds and use a greatly simplified circuit design.

In some implementations, some of the components of FIG. 4 can be combined. In various designs, one or more of the components (alone or in combination), other than memory array 126, can be thought of as a control circuit. For example, a control circuit may include any one of, or a combination of, control circuitry 110, state machine 112, decoders 114/124/132, power control module 116, sense blocks 130, read/write circuits 128, wide I/O interface 140 and/or a controller.

Figure 5:
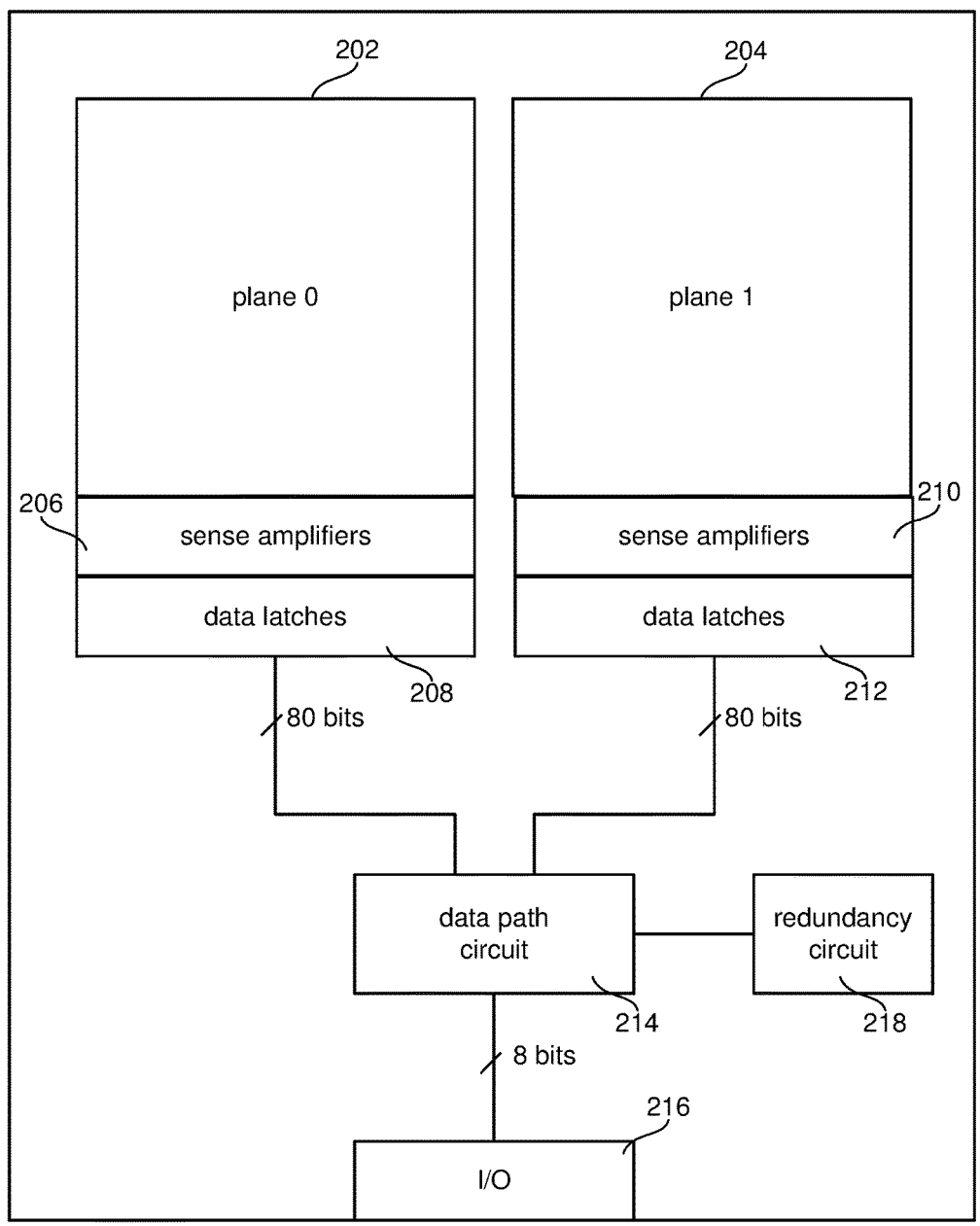
FIG. 5 is a block diagram of one embodiment of a data path for a prior art memory die.

FIG. 5 is a block diagram of one embodiment of a prior art memory die 200. However, FIG. 5 has been simplified to the show data path for prior art memory die 200. FIG. 5 shows the memory die having two planes of memory cells plane 0 (202) and plane 1 (204). Each plane is a monolithic three dimensional memory structure. FIG. 5 also shows sense amplifiers 206 communicating with plane 0 and data latches 208 in communication with sense amplifier 206. Similarly, sense amplifier 210 communicate with plane 1 and data latches 212 communicate with sense amplifier 210. Data path circuit 214 is connected to I/O interface 216, data redundancy circuit 218, data latches 208 and data latches 212. Data being programmed is received at I/O interface 216 and provided to data path circuit 214. The data is then routed to the appropriate set of data latches within data latches 208 and/or data latches 212. Sense amplifiers 206 and/or 210 are used to program the data into the appropriate plane of memory. In some cases, one or more of the data latches can become faulty. The system can keep a separate set of latches as replacement latches for faulty latches. Redundancy circuit 218 is used to readdress one or more bits of data to a replacement latch. The redundancy data circuit stores the indication of which latches are bad and determines how to manipulate the data to use the replacement latches. Alternatively, redundancy 218 can be used to reroute data from a broken latch to another unbroken latch (even if the other latch is not a replacement latch).

Figure 6:
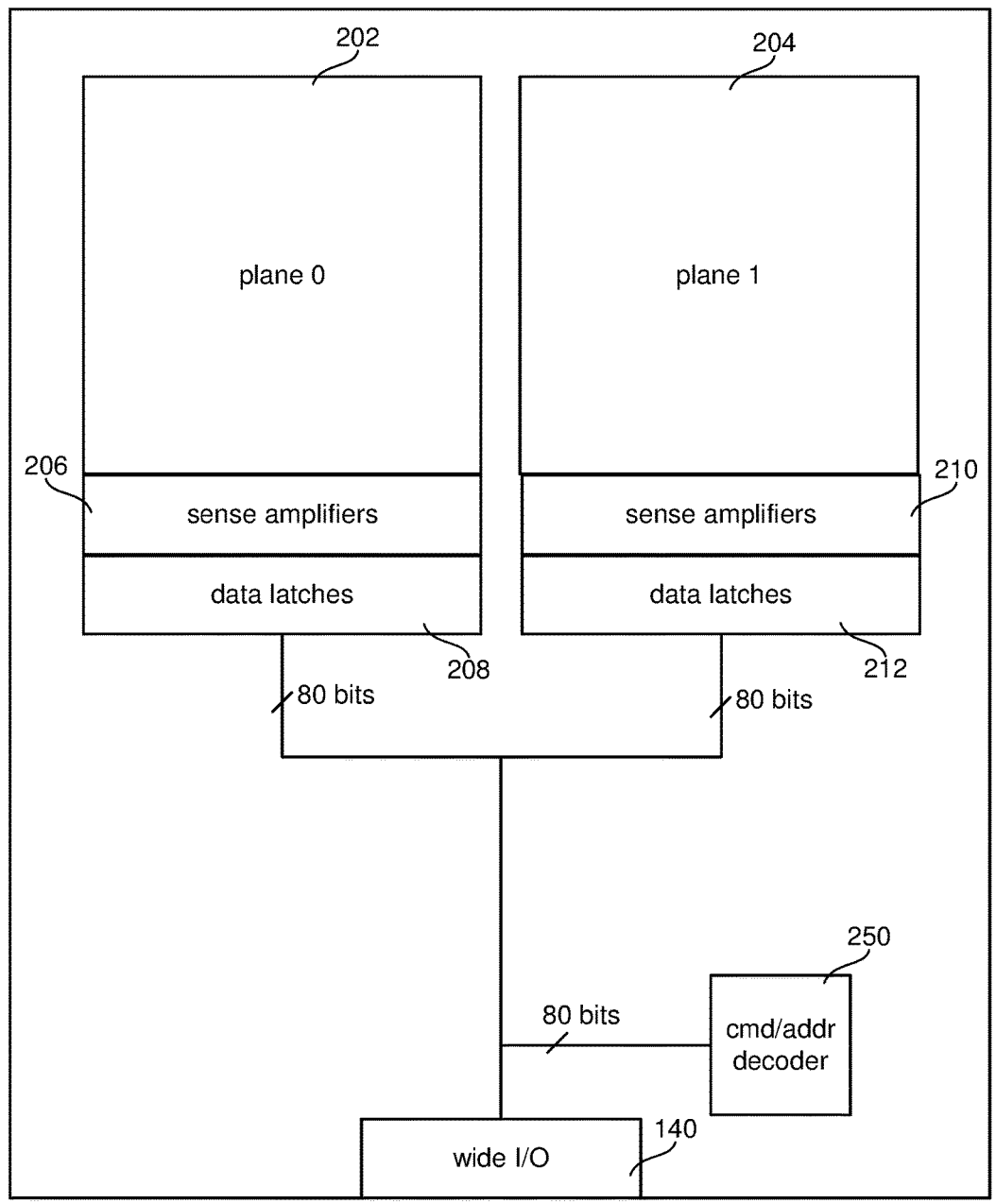
FIG. 6 is a block diagram of one embodiment of a data path for a memory die.

FIG. 6 is a block diagram of memory die 108, but simplified to show the data path for memory die 108. Similar to FIG. 5, memory die 108 includes plane 0 (202), plane 1 (204), sense amplifier 206, data latches 208, sense amplifier 210 and data latches 212. However, memory die 108 does not include data path circuit 214 or redundancy circuit 218. In this embodiment of memory die 108, data path circuit 214 and redundancy circuit 218 had been removed from each of the memory dies of the plurality of memory dies 6 and added to the interface circuit implemented on interface circuit 4. This way, rather than having eight copies of data path circuit 214 and redundancy circuit 218, only one copy is needed. This saves room in the memory die 108, thereby making memory die 108 smaller and less expensive. Memory die 108 does include an extra circuit, cmd/addr decoder circuit 250, however this circuit is significantly smaller than the combination of data path circuit 214 and redundancy circuit 218.

Memory die 108 includes wide I/O interface 140 (discussed above with respect to FIG. 4) which receives 91 signals, 80 of which are data bus, Bus[0:79]. The 80 bit data bus is provided to data latches 208, data latches 212 and CMD/ADDR decoder 250. When data bus is used to carry a command or address, that information is provided to cmd/addr decoder circuit 250 which decodes the command or address and provides that information to state machine 112. Wide I/O interface 140 will also include the protocol signals discussed above. However, the protocol signals are not depicted in FIG. 6. In one embodiment, the protocol signals are provided to control circuitry 110 (see FIG. 4).

FIG. 7 is a block diagram of one embodiment of interface circuit 4 implemented on interface die 10. Interface circuit 4 includes memory interface 302, data path circuit 320, redundancy circuit 330, controller interface 310 and control logic 332. Memory interface 302 implements the wide I/O interface also implemented by interface 140 and described above with respect to Table 1. Memory interface 302 communicates with data bus 304 and protocol signals 306 with each of the memory die 108 of the plurality of memory dies 6.

Controller interface 310 implements the narrow I/O interface that includes less bits/signals in the data bus as compared to the data bus of the wide I/O interface implemented by memory interface 302. The narrow I/O interface can be a synchronous interface or an asynchronous interface. Examples of a narrow I/O interface include a Toggle Mode Interface and an Open NAD Flash Interface (ONFI). Other narrow I/O interfaces can also be used. Toggle mode (e.g., Toggle Mode 2.0 JEDEC Standard) is an asynchronous memory interface that supports SDR and DDR with a DQS signal acting as a data strobe signal. The table below provides a definition of one example of Toggle Mode Interface.

| Signal Name | Type | Function |
| --- | --- | --- |
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/ erase protection during power transitions. The internal high voltage generator is reset when the WPn pin is active low. |
| DQS | Input/ Output | Data Strobe acts as an output when reading data, and as an input when writing data. DQS is edge-aligned with data read; it is center-aligned with data written. |
| DQSn | Input/ Output | Data Strobe complement (used for DDR) |
| Bus[0:7] | Input/ Output | Data Input/Output (I/O) bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |

Controller interface 310 provides a set of protocol signals 314 to a controller and an 8 bit data bus 312 (Bus[0:7]) to the controller. In one embodiment, the protocol signals include ALE, CLE, RE, REn, WEn, WPn, DQS, and DQSn. Control interface 310 is connected data path circuit 320 by 8 bit bus 324. Data path circuit 320 is then connected to memory interface 302 by an 80 bit data bus 322. Data path circuit 320 is analogous to data path circuit 214 of FIG. 5. Interface circuit 4 also includes control logic 332, which is in communication with controller 310, redundancy circuit 330, memory interface 302 and data path circuit 320. In one embodiment, control logic 332 is a processor, microprocessor, controller, FPGA, state machine or other type of control logic implement as an electrical circuit. When performing a programming process, data is provided by controller 2 to interface circuit 4 as a set of 8 bit messages, which are aggregated into an 80 bit message by data path circuit 320 and provided to memory interface 302 for communication to the appropriate memory die 108. With large datasets, multiple 80 bit data messages will be communicated. Redundancy circuit 330 is analogous to redundancy circuit 218 of FIG. 5.

Moving the data path circuit 214 and redundancy circuit 218 to interface circuit 4 reduces the cost of memory die 108 and, therefore, can compensate for the cost of the interface circuit 4 (as well as the cost of cmd/addr decoder circuit 250).

FIG. 8 is a block diagram of one embodiment of data path circuit 320. The circuit of FIG. 8 includes a first-in-first-out (FIFO) buffer 400, read/write multiplexer 402, serial-in-parallel-out ("SIPO") circuit 404 and parallel-in-serial-out ("PISO") circuit 406. Read/write multiplexer 402 is connected to 8 bit bus 324. FIFO 400 is connected to 80 bit bus 322. Data received by read/write multiplexer 402 from controller interface 310 via bus 324 is provided to SIPO 404. SIPO 404 aggregates ten 8 bit messages received serially into one larger 80 bit message (parallel) and provides that 80 bit message to FIFO 400. When data is read from a memory die 108, that data is provided to FIFO 400 via bus 322 and memory interface 302. Read data stored in FIFO 400 is provided as 80 bit messages to PISO 406, which deconstructs the 80 bit message into ten 8 bit messages. PISO 406 sends those ten 8 bit messages serially to read/write multiplexer 402, which provides the data onto bus 324. Both FIFO 400 and read/write multiplexer 402 are controlled by control logic 332 to operate between read mode and program mode (write mode).

FIG. 9 is a flowchart describing one embodiment in the process of operating the components of FIGS. 1, 2A-D, 3, 4, 6, 7 and 8 in order to communicate from controller 2 to one or more of the memory die 108 of plurality of memory dies 6. In step 500, controller 2 sends multiple messages (e.g., 10 or a multiple of 10 or a different amount) in a narrow format (e.g., 8 bits) on a narrow I/O interface to interface circuit 4 at a first speed. In step 502, controller 2 sends protocol signals to interface circuit 4 concurrently with the sending of the multiple messages of step 500. Steps 500 and 502 are performed using the narrow I/O interface. As discussed above, one example of a narrow I/O interface is the Toggle Mode Interface. In step 504, interface circuit 4 receives the messages on the narrow I/O interface (e.g., via controller interface 310). In step 504, interface circuit 4 converts the multiple messages in a narrow format to one message in a wide format. For example, SIPO 404 will aggregate ten messages that are 8 bits wide into one message that is 80 bits wide. In step 508, interface circuit 4 sends the aggregated 80 bit message to all memory dies 108 of the plurality of memory dies 6 on the wide I/O interface in wide format at a second speed. For example, interface die sends the message via memory interface 302 which implements the wide I/O interface discussed above with respect to Table 1. Note that the first speed used by the narrow I/O interface is significantly faster than the second speed used by the wide I/O interface. For example, the 80 bit wide I/O interface will operate at 50 MHZ DDR to achieve one gigabyte per second transfer rate while the 8 bit narrow I/O interface will operate at 500 HZ DDR to achieve the same data rate. That is, the wide I/O interface is ten times wider; therefore, the narrow I/O interface has to be operated at ten times the speed to achieve the same data rate.

Because the wide I/O interface is operating at a slower speed, the drivers and contact pads can be made smaller. This results in the wide I/O interface having much smaller capacitance and using less power. This enables stacking more dies with the wide I/O interface. In step 510, interface circuit 4 sends the protocol signals to all of the memory dies 108 of the plurality of memory dies 6 concurrently with sending the message on the data bus during step 508. In step 512, the appropriate one or more memory die 108 that are addressed will act on the message. Note that the steps of FIG. 9 are for sending one set of messages. However, a given process may include multiple sets of messages. For example, first a command may be sent, then address may be sent, then data may be sent. Thus, the process of FIG. 9 may be performed multiple times for a memory operation.

Figure 10:
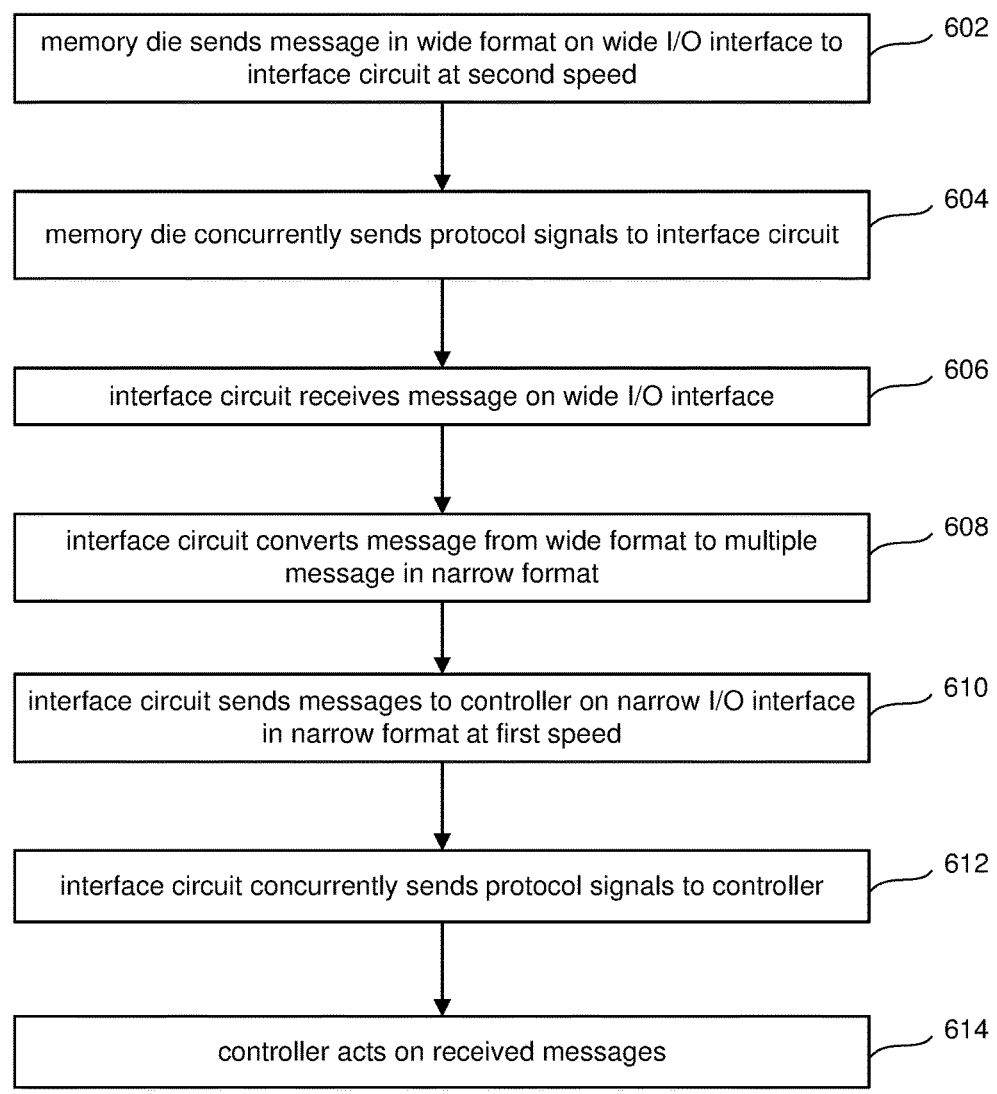
FIG. 10 is a flow chart describing one embodiment of a process for communicating from a memory die to a controller.

FIG. 10 is a flowchart describing one embodiment of a process for communicating from a memory die 108 to controller 2. The process of FIG. 10 includes sending one 80 bit message from the memory die. That message could be data read from the memory structure 126. If the data read is more than 80 bits, the process of FIG. 10 will be repeated multiple times. In step 602, memory die 108 sends a message in the wide format (e.g., 80 bits) on the wide I/O interface (e.g., wide I/O interface 140) to interface circuit 4 at the second speed. In step 604, memory die 108 concurrently sends the protocol signals to interface circuit 4. In step 606, interface circuit 4 receives the message on the wide I/O interface. For example, interface circuit 4 receives the 80 bit message at memory interface 302. In step 608, interface circuit 4 converts the message from wide format (e.g., 80 bits) to multiple messages in a narrow format (ten messages at 8 bits). For example, PISO 406 converts a single 80 bit message to ten 8 bit messages. In step 610, interface circuit 4 sends the multiple messages to controller 2 via the narrow I/O interface in a narrow format at the first speed. For example, controller interface 310 will send ten 8 bit messages via data bus 312 from controller interface 310 to controller 2. In step 612, interface circuit 4 sends the protocol signals to controller 2 concurrently while sending the messages of step 610. In step 614, controller 2 acts on the received messages.

In the proposed design, the I/O pitch for the contact pads stays the same (the dimensions of the area where the contact pads are stays the same) with respect to prior designs; however, smaller contact pads are used to accommodate the additional signal lines. The system can use smaller contact pads because the wide I/O interface is operating at a slower speed. Because the wide I/O interface is running at a slower speed, the noise experienced by the signals will be lower; therefore, the signal to noise ratio will be higher and there will be no need to increase the power used for the signals. Additionally, because smaller pads are used and the interface is operated at a slower speed, small drivers are used. The use of smaller drivers and smaller pads reduces pin capacitance. With lower capacitance, more memory dies 108 can be added to the stack of memory dies formed by the plurality of memory dies 6, power will be reduced and high throughput is achieved.

The various control circuits of memory die 108 (see FIG. 4), including wide I/O interface 140, are implemented using large CMOS transistors. This is because these transistors must be able to withstand the manufacturing process for memory structure 126, which includes heating the device. Therefore, these transistors are made larger (e.g., larger channel lengths and thicker gates), resulting in higher threshold voltages. On the other hand, interface circuit 4 is not subjected to the same fabrication process as memory die. Therefore, the transistors that make up interface circuit 4 can be the latest state of the art transistors that have smaller dimensions (e.g., smaller channel lengths and thinner gates) than the transistors of memory die 108. Additionally, the transistors of interface circuit 4 will have a lower threshold voltage than the transistors of memory die 108. As a result, the transistors of interface circuit 4 can be operated at much faster speed (e.g., higher clock rate) than the transistors of memory die 108. This is another reason that enables the narrow I/O interface between controller 2 and interface circuit 4 to operate at a faster speed (e.g., higher clock rate)

than the wide I/O interface between interface circuit 4 and plurality of memory die 6. Because the wide I/O interface between interface circuit 4 and plurality of memory die 6 is operated at a slower speed, the signal drivers in interface circuit 4 for the wide I/O interface between interface circuit 4 and plurality of memory die 6 can be made smaller than the signal drivers in interface circuit 4 for the narrow I/O interface between interface circuit 4 and controller 2, which uses less power per signal. The signal drivers can be made smaller both in terms of the size of the electrical components that make up the driver circuit as well as the area that the signal driver circuit occupies.

One embodiment includes a non-volatile storage system comprising a plurality of memory dies and an interface circuit. Each memory die includes a wide I/O interface electrically coupled to another wide I/O interface of another memory die of the plurality of memory dies. The interface circuit is physically separate from the memory dies. The interface circuit includes a first interface and a second interface. The first interface comprises a wide I/O interface electrically coupled to a wide I/O interface of at least one of the memory dies of the plurality of memory dies. The second interface is a narrow I/O interface configured to communicate with an external circuit (e.g., a controller or host).

One embodiment includes a non-volatile storage apparatus, comprising: a substrate having a first set of contact pads that implement a narrow data bus; an interface die mounted above the substrate, the interface die having a second set of contact pads that implement the narrow data bus, the interface die having a third set of contact pads that implement a wide data bus, the wide data bus has more signals than the narrow data bus, the second set of contact pads has less contact pads than the third set of contact pads, the interface die operates the narrow data bus at a higher speed than the interface die operates the wide data bus; wire bonds between the first set of contact pads and the second set of contact pads; a first non-volatile memory die mounted above the interface die, the first non-volatile memory die having a fourth set of contact pads that implement the wide data bus; wire bonds between the third set of contact pads and the fourth set of contact pads; a second non-volatile memory die mounted above the first non-volatile memory die to form a stack of memory dies that includes at least the first non-volatile memory die and the second non-volatile memory die, the second non-volatile memory die having a fifth set of contact pads that implement the wide bus; and wire bonds between the fourth set of contact pads and the fifth set of contact pads.

One embodiment includes a method of operating non-volatile storage, comprising: sending a first message in a wide format via a wide I/O interface from a first memory die to an interface die at a memory die speed; converting the first message from the wide format to a first set of multiple messages in a narrow format at the interface die; and sending the first set of multiple messages from the interface die to a controller via a narrow I/O interface at a controller speed, the controller speed is faster than the memory speed.

One embodiment includes a non-volatile storage apparatus, comprising: a stack of memory dies wire bonded together and an interface die. The stack of memory dies are electrically connected to the interface die by wire bonds between at least one of the memory dies and the interface die. The interface dies comprises means for communicating with a controller using a narrow I/O interface at a first speed and for communicating with the memory dies via the wire bonds using a wide I/O interface at a second speed, the second speed is slower than the first speed.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a plurality of memory dies, each memory die having a wide I/O interface that is part of the respective memory die; and
an interface circuit physically separate from the memory dies, the interface circuit having a first interface and a second interface, the first interface comprising a wide I/O interface, the second interface configured to communicate with an external circuit, the second interface is a narrow I/O interface with less I/O signals than the wide I/O interface, the wide I/O interfaces of the memory dies are directly electrically connected together and directly electrically connected to the wide I/O interface of the interface circuit;
the interface circuit configured to receive multiple messages on the narrow I/O interface, convert the multiple messages from a narrow format to one message in a wide format and send the one message in the wide format to all of the memory dies of the plurality of memory dies via the wide I/O interface of the interface circuit directly electrically connected to the wide I/O interfaces of the memory dies.

2. The apparatus of claim 1, wherein:
the second interface operates at a faster speed than the wide I/O interface.

3. The apparatus of claim 1, wherein:
the wide I/O interface on each memory die is implemented with first transistors; and the second interface on the interface die is implemented with second transistors, the second transistors are smaller than the first transistors.

4. The apparatus of claim 1, wherein:
the wide I/O interface includes a data bus that is at least 5 times wider than a data bus for the narrow I/O interface.

5. The apparatus of claim 1, wherein:
the interface circuit is implemented on an interface die;
the first interface has a first set of drivers for the wide I/O interface;
the second interface has a second set of drivers for the narrow I/O interface; and
the first set of drivers are smaller in size than the second set of drivers.

6. The apparatus of claim 1, wherein:
the plurality of memory dies are configured to form a first stack of memory dies with wide I/O interfaces wire bonded together; and
the interface circuit is implemented on an interface die.

7. The apparatus of claim 6, wherein:
the wire bonds form uninterrupted straight lines of wire bonds from the top of the first stack down to the bottom of the first stack and from the bottom of the first stack to the interface die.

8. The apparatus of claim 6, further comprising:
a second stack of memory dies, the second stack of memory dies are mounted on top of the first stack of memory dies, each memory die of the second stack of memory dies has a wide I/O interface wire bonded to another wide I/O interface of another memory die of the second stack of memory dies, the interface die includes a third interface, the third interface is a wide I/O interface wire bonded to a wide I/O interface of at least one of the memory dies of the second stack of memory dies.

9. The apparatus of claim 1, wherein:
the interface circuit comprises a memory interface, a controller interface and a data path circuit connected to the memory interface and the controller interface; and
the data path circuit includes a buffer connected to the memory interface, a multiplexer connected to the controller interface, a serial-in-parallel-out circuit connected to and between the buffer and the multiplexer, and a parallel-in-serial-out circuit connected to and between the buffer and the multiplexer, the multiplexer connected between the controller interface and the serial-in-parallel-out circuit.

10. The apparatus of claim 1, wherein:
the wide I/O interface is a parallel communication interface that includes an I/O bus configured to communicate data signals, the I/O bus includes a number of I/O signal lines that is greater, by at least a multiplication factor, than an I/O bus of the second interface, the multiplication factor is a whole number greater than one.

11. The apparatus of claim 1, wherein:
the wide I/O interface on the memory dies is implemented with first transistors; and
the second interface on the interface die is implemented with second transistors, the second transistors have lower threshold voltages than the first transistors.

12. A non-volatile storage apparatus, comprising:
a stack of memory dies, each memory die having a wide I/O interface that is part of the respective memory die; and
an interface die comprising a wide interface and a narrow interface, the wide I/O interfaces of the stack of memory dies are wire bonded together and wire bonded to the wide interface of the interface die, the interface die comprises means for communicating with a controller using the narrow interface at a first speed and for communicating with the memory dies via the wire bonds using the wide interface at a second speed that is slower than the first speed by receiving a message on the wide interface at the second speed, converting the received message from one message in a wide format to multiple messages in a narrow format and sending the multiple messages to the controller via the narrow interface in the narrow format at the first speed.

13. The apparatus of claim 12, wherein:
the interface die comprises a memory interface, a controller interface and a data path circuit connected to the memory interface and the controller interface; and
the data path circuit includes a buffer connected to the memory interface, a multiplexer connected to the controller interface, a serial-in-parallel-out circuit connected to and between the buffer and the multiplexer, and a parallel-in-serial-out circuit connected to and between the buffer and the multiplexer, the multiplexer connected between the controller interface and the serial-in-parallel-out circuit.

14. The apparatus of claim 12, wherein:
the wide interface of the interface die is a parallel communication interface that includes an I/O bus configured to communicate data signals, the I/O bus includes a number of I/O signal lines that is greater, by at least a multiplication factor, than an I/O bus of the second interface, the multiplication factor is a whole number greater than one.

15. An apparatus, comprising:
a memory die having a wide I/O interface; and
an interface circuit physically separate from the memory die, the interface circuit having a wide I/O interface and a narrow I/O interface, the narrow I/O interface is separate from the wide I/O interface of the interface circuit and has less I/O signals than the wide I/O interface of the interface circuit, the narrow I/O interface configured to communicate with an external circuit, the wide I/O interface of the interface circuit is directly electrically connected to the wide I/O interface of the memory die;
the interface circuit configured to receive multiple messages on the narrow I/O interface, convert the multiple messages from a narrow format to one message in a wide format and send the one message in the wide format to the memory die via the wide I/O interface of the interface circuit directly electrically connected to the wide I/O interface of the memory die.

16. The apparatus of claim 15, wherein:
the interface circuit comprises a memory interface, a controller interface and a data path circuit connected to the memory interface and the controller interface; and
the data path circuit includes a buffer connected to the memory interface, a multiplexer connected to the controller interface, a serial-in-parallel-out circuit connected to and between the buffer and the multiplexer, and a parallel-in-serial-out circuit connected to and between the buffer and the multiplexer, the multiplexer connected between the controller interface and the serial-in-parallel-out circuit.

17. The apparatus of claim 15, wherein:
the wide I/O interface of the interface circuit is a parallel communication interface that includes an I/O bus configured to communicate data signals, the I/O bus includes a number of I/O signal lines that is greater, by at least a multiplication factor, than an I/O bus of the narrow interface, the multiplication factor is a whole number greater than one.

* * * * *